(12) United States Patent
England et al.

(10) Patent No.: US 7,655,933 B2
(45) Date of Patent: Feb. 2, 2010

(54) TECHNIQUES FOR TEMPERATURE-CONTROLLED ION IMPLANTATION

(75) Inventors: Jonathan Gerald England, Horsham (GB); Richard Stephen Muka, Topsfield, MA (US); Scott C Holden, Melrose, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 364 days.

(21) Appl. No.: 11/778,335

(22) Filed: Jul. 16, 2007

(65) Prior Publication Data

US 2008/0042078 A1   Feb. 21, 2008

Related U.S. Application Data

(60) Provisional application No. 60/837,876, filed on Aug. 15, 2006.

(51) Int. Cl.
   *H01J 37/317* (2006.01)
(52) U.S. Cl. .............. 250/492.21; 250/443.1; 118/723 R; 216/62; 216/87; 427/523
(58) Field of Classification Search ............. 250/492.21
   See application file for complete search history.

(56) References Cited

U.S. PATENT DOCUMENTS

| | | | |
|---|---|---|---|
| 4,724,300 A * | 2/1988 | Dearnaley | 219/121.35 |
| 6,111,260 A * | 8/2000 | Dawson et al. | 250/492.21 |
| 6,259,072 B1 | 7/2001 | Kinnard et al. | |
| 6,458,723 B1 | 10/2002 | Henley et al. | |
| 6,476,362 B1 | 11/2002 | Deacon et al. | |
| 7,159,599 B2 | 1/2007 | Verhaverbeke et al. | |
| 7,547,897 B2 * | 6/2009 | Suvorov | 250/492.21 |
| 2002/0076492 A1 | 6/2002 | Loan et al. | |
| 2003/0029833 A1 | 2/2003 | Johnson | |
| 2005/0183669 A1 | 8/2005 | Parkhe et al. | |
| 2008/0044257 A1 * | 2/2008 | England et al. | 414/217.1 |

FOREIGN PATENT DOCUMENTS

WO   2006069085 A2   6/2006

* cited by examiner

*Primary Examiner*—Jack I Berman

(57) ABSTRACT

Techniques for temperature-controlled ion implantation are disclosed. In one particular exemplary embodiment, the techniques may be realized as an apparatus for high-temperature ion implantation. The apparatus may comprise a platen to hold a wafer in a single-wafer process chamber during ion implantation, the platen having a wafer interface to provide a predetermined thermal contact between the wafer and the platen. The apparatus may also comprise an array of heating elements to heat the wafer while the wafer is held on the platen to achieve a predetermined temperature profile on the wafer during ion implantation, the heating elements being external to the platen. The apparatus may further comprise a post-implant cooling station to cool down the wafer after ion implantation of the wafer.

40 Claims, 12 Drawing Sheets

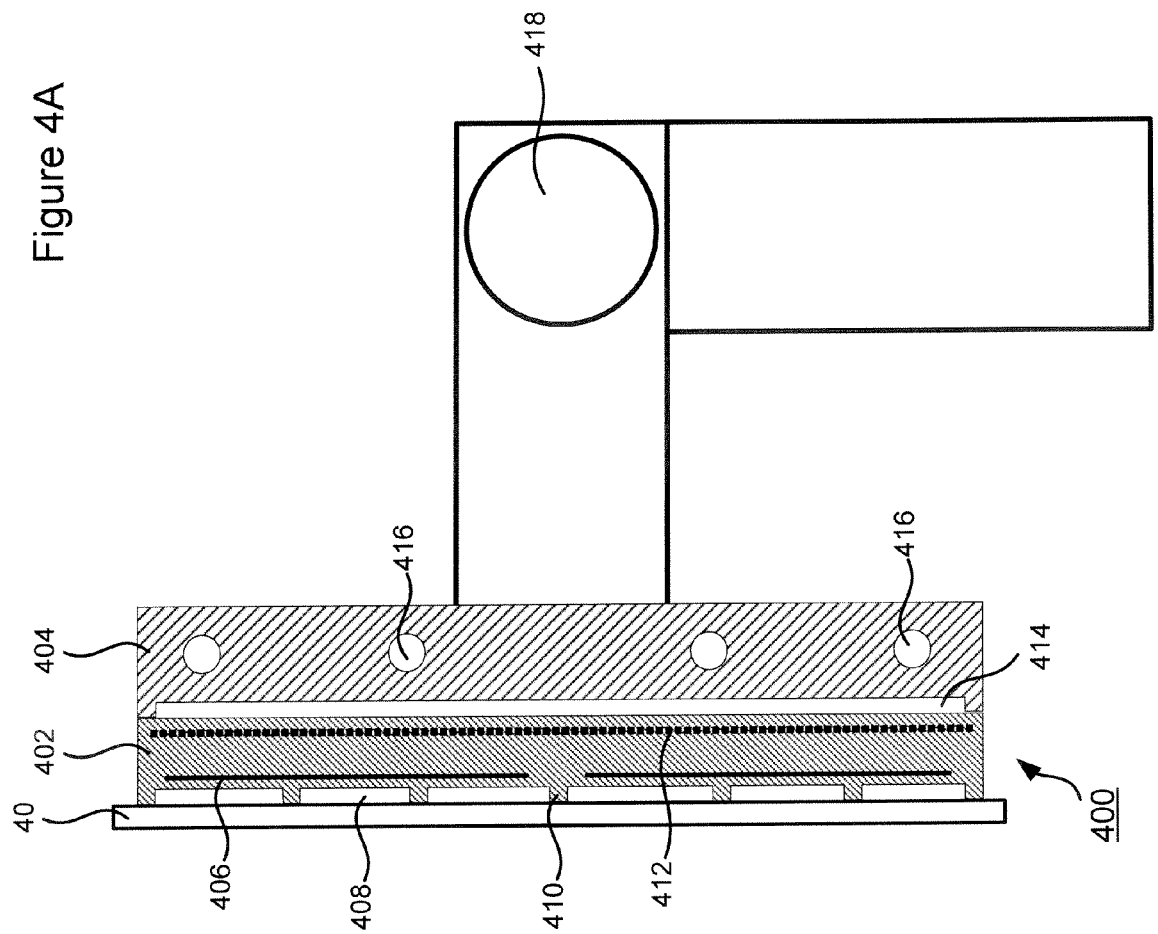

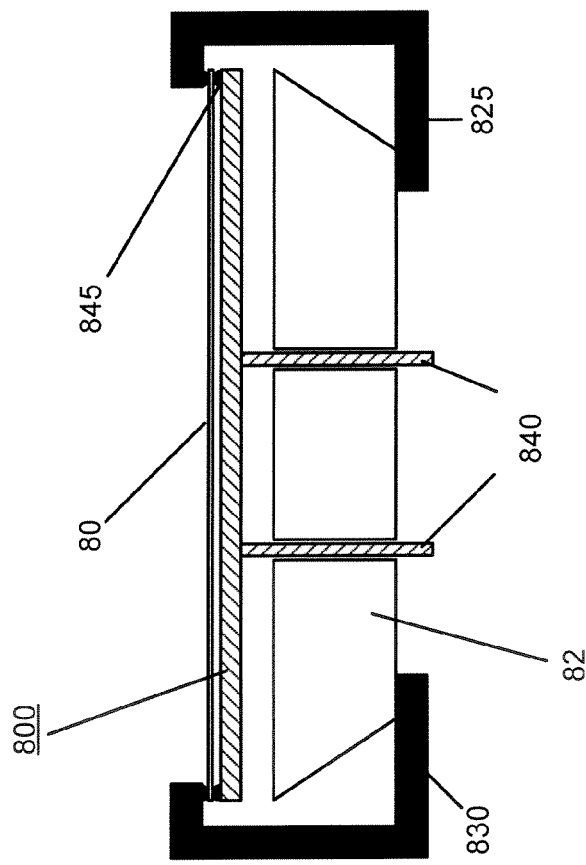
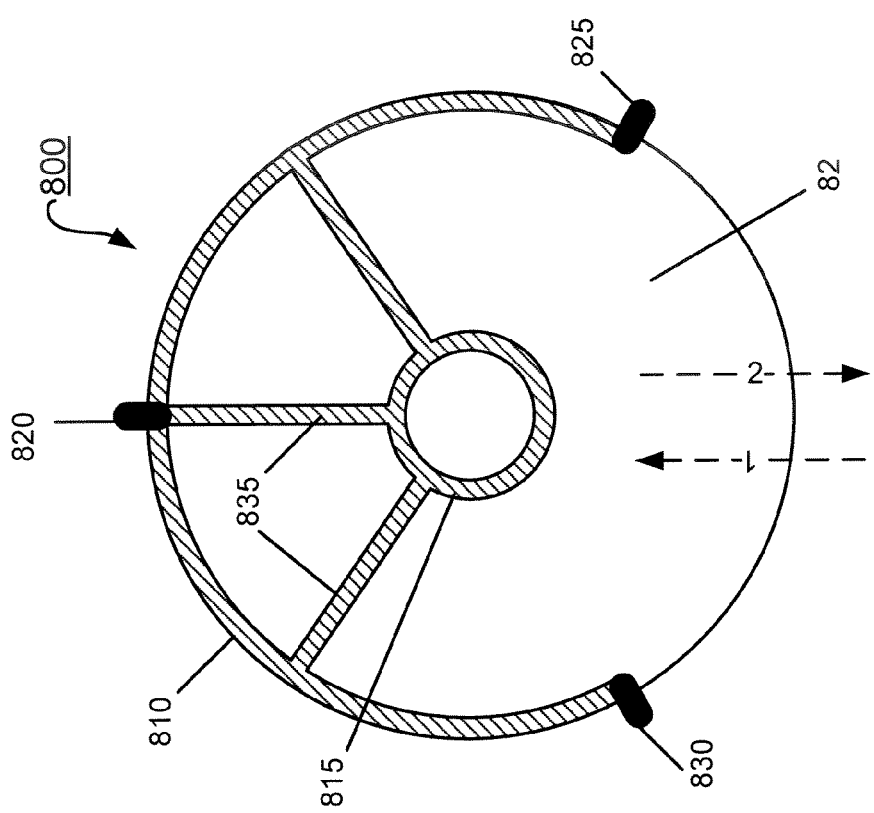

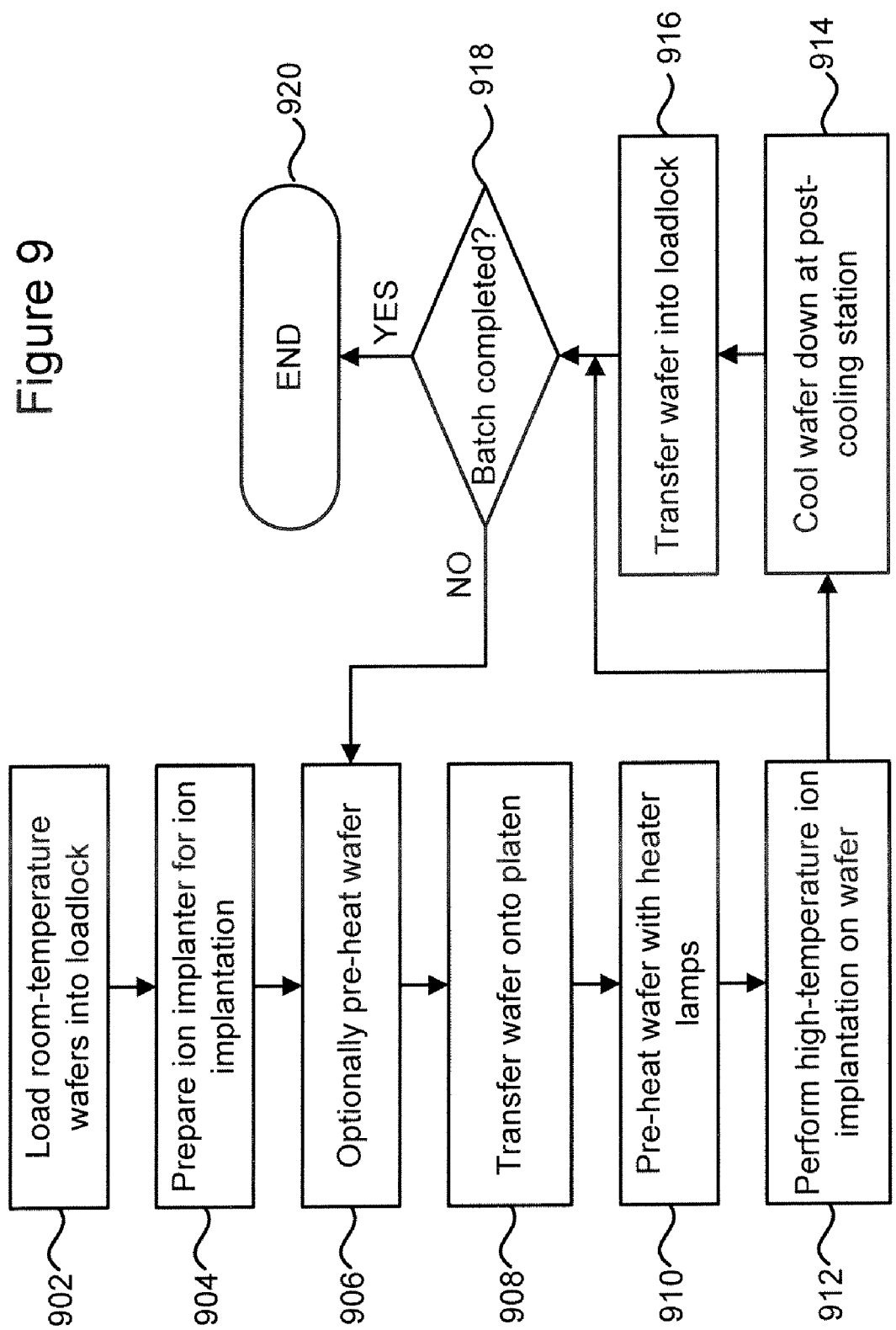

TECHNIQUES FOR TEMPERATURE-CONTROLLED ION IMPLANTATION

CROSS-REFERENCE TO RELATED APPLICATIONS

This patent application claims priority to U.S. Provisional Patent Application No. 60/837,876, filed Aug. 15, 2006, which is hereby incorporated by reference herein in its entirety.

FIELD OF THE DISCLOSURE

The present disclosure relates generally to semiconductor manufacturing and, more particularly, to techniques for temperature-controlled ion implantation.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energies.

As critical dimensions of microelectronic devices continue to shrink, there have been ever increasing efforts to improve device performance and process yield. It has been discovered that high-temperature ion implantation (i.e., with a target wafer in a temperature range well above room temperature, such as 150-600° C.) may offer significant advantages over room-temperature ion implantation.

Although high-temperature ion implantation has been attempted, existing approaches suffer from a number of deficiencies. For example, high-temperature ion implantation techniques have been developed for batch-wafer ion implanters specialized for oxygen implantation while the current trend in the semiconductor industry favors single-wafer ion implanters capable of implanting multiple ion species.

In research environments, some high-temperature ion implantation has been performed in single-wafer ion implanters, often on small substrates mechanically held on sample manipulators. However, such research implementations do not have a high, production-worthy throughput for large substrates and often suffer from a high level of metal and particulate contamination.

In addition, plasma doping (PLAD) techniques are seeing an increased use in semiconductor manufacturing. Thus, there is also a need for high-temperature ion implantation with PLAD systems.

In view of the foregoing, it may be understood that there are significant problems and shortcomings associated with current temperature-controlled ion implantation technologies.

SUMMARY OF THE DISCLOSURE

Techniques for temperature-controlled ion implantation are disclosed. In one particular exemplary embodiment, the techniques may be realized as an apparatus for high-temperature ion implantation. The apparatus may comprise a platen to hold a wafer in a single-wafer process chamber during ion implantation, the platen having a wafer interface to provide a predetermined thermal contact between the wafer and the platen. The apparatus may also comprise an array of heating elements to heat the wafer while the wafer is held on the platen to achieve a predetermined temperature profile on the wafer during ion implantation, the heating elements being external to the platen. The apparatus may further comprise a post-implant cooling station to cool down the wafer after ion implantation of the wafer.

In another particular exemplary embodiment, the techniques may be realized as a method for high-temperature ion implantation. The method may comprise the step of holding a wafer on a platen in a single-wafer process chamber. The method may also comprise the step of providing an array of heating elements to heat the wafer while the wafer is held on the platen, the heating elements being external to the platen. The method may further comprise the step of controlling output intensity of the array of heating elements relative to the platen to achieve a predetermined temperature profile on the wafer during ion implantation.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 4A shows an exemplary platen for high-temperature ion implantation in accordance with an embodiment of the present disclosure.

FIGS. 8A and 8B show an exemplary design of a wafer support structure ("spider") in accordance with an embodiment of the present disclosure.

FIG. 9 shows a flow chart illustrating an exemplary method for high-temperature ion implantation in accordance with an embodiment of the present disclosure.

DETAILED DESCRIPTION OF EXEMPLARY EMBODIMENTS

Embodiments of the present disclosure provide techniques for temperature-controlled, high-throughput ion implantation which may preferably be implemented in single-wafer ion implanters. To perform high-temperature ion implantation, a target wafer may be heated to and maintained in a desired temperature range above room temperature. The wafer may be either pre-heated before it is loaded onto a platen or heated while it is on the platen, for example, by heater lamps, plasma discharges, the platen itself, or a combination thereof. Immediately after high-temperature ion implantation on the wafer, the wafer may be transferred to a post-cooling station to cool down, and the same or similar high-temperature ion implantation process may be performed on a next wafer without any substantial pause. In addition, a room-temperature ion implanter may be configured or adapted to support both high-temperature and low-temperature ion implantations.

The temperature-controlled ion implantation techniques disclosed herein may be implemented for all types of ion implantation processes as well as plasma doping (PLAD) which is also referred to as plasma immersion ion implantation (PIII). Existing ion implanters may be modified or new ion implanters may be built to provide hot and/or cold implant capabilities as will be described in detail below.

As used herein, a "temperature range" refers to a particular temperature value (e.g., 300° C.) or a range of temperature values either between two specified temperature points (e.g., 300° C.~400° C.) or above or below a specified temperature (e.g., ≧250° C. or ≦600° C.). As used herein, an "end station" refers to a part of an ion implanter where a wafer is held during ion implantation. An end station typically includes an ion implantation process chamber, and may include, be coupled to, or otherwise be in proximity to one or more thermal conditioning units as will be described in detail below.

Figure 1:
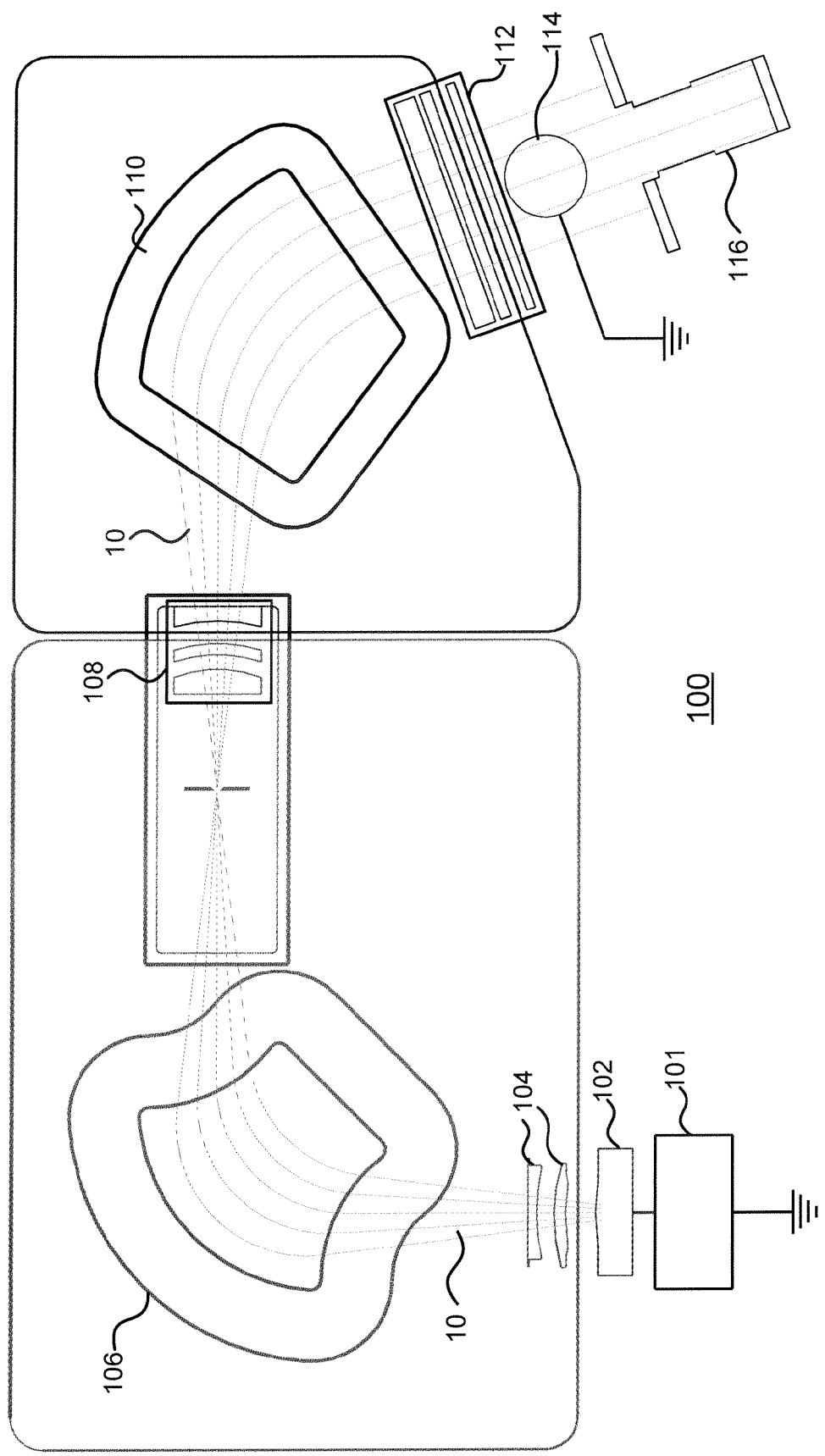
FIG. 1 depicts a traditional ion implanter system in which techniques for temperature-controlled ion implantation may be implemented in accordance with an embodiment of the present disclosure.

FIG. 1 depicts a traditional ion implanter system 100 in which techniques for temperature-controlled ion implantation may be implemented in accordance with an embodiment of the present disclosure. As is typical for most beam-line ion implanter systems, the system 100 is housed in a high-vacuum environment. The ion implanter system 100 may comprise an ion source 102, biased to a potential by a power supply 101, and a series of beam-line components through which an ion beam 10 passes. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can filter and focus the ion beam 10 before steering it towards a target wafer. During ion implantation, the target wafer is typically mounted on a platen 114 that can be moved in one or more dimensions (e.g., translate, rotate, and tilt) by an apparatus. The ion beam 10 may be measured with one or more devices, such as a Faraday cup 116.

Figure 2:
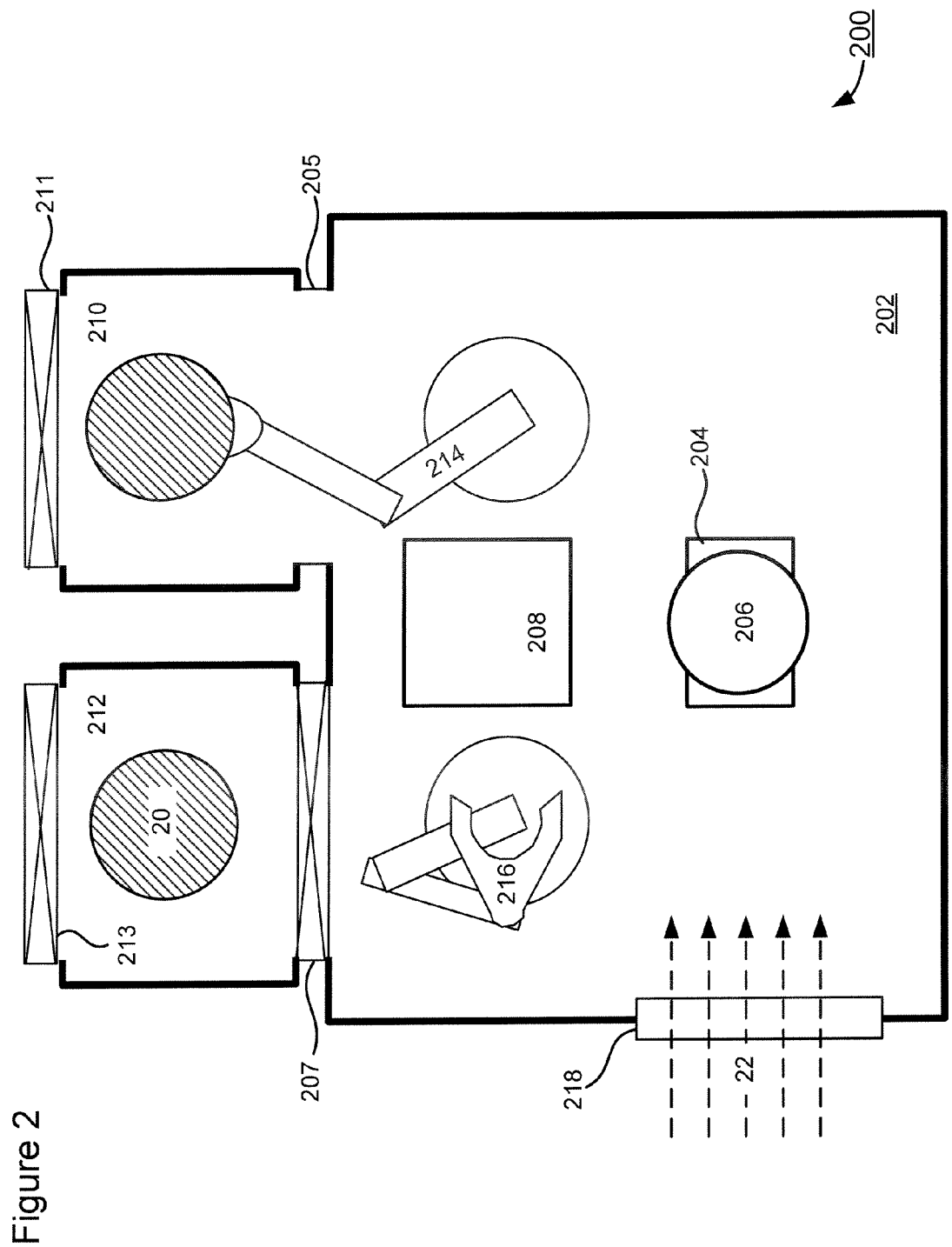
FIG. 2 shows an exemplary end station that may be configured for temperature-controlled ion implantation in accordance with an embodiment of the present disclosure.

FIG. 2 shows an exemplary end station 200 that may be configured for temperature-controlled ion implantation in accordance with an embodiment of the present disclosure. The end station 200 may comprise loadlocks 210 and 212 coupled to a process chamber 202. The end station 200 may also comprise transfer robots 214 and 216, an orientor 208, and a platen 206 (with an scanner mechanism 204) in the process chamber 202. An ion beam 22 may enter the process chamber 202 through a window or port 218.

For conventional room-temperature ion implantation, a wafer 20 may be introduced from atmosphere into the loadlock 212 through a vacuum valve 213 by an atmospheric robot (not shown). Once the loadlock 212 has been evacuated by a pump (not shown), a gate valve 207 which leads into the process chamber 202 may be opened. The wafer 20 may be removed by the transfer robot 216 and placed onto the orientor 208. The loadlock 210 (with a gate valve 205) and the transfer robot 214 may operate in a similar manner. The orientor 208, shared between both the loadlocks (210, 212) and the transfer robots (214, 216), may locate the center of the wafer 20 and determine its crystal orientation from the position of a notch. Once the wafer 20 has been properly oriented, the transfer robot 216 may place the wafer 20 onto the platen 206, which is shown here in a horizontal load position. In the horizontal load position, the wafer 20 may be above the height at which the ion beam 22 enters the process chamber 202. The platen 206 may have a wafer clamping mechanism (details not shown) to secure the wafer 20 (e.g., with an electrostatic force). Once the platen 206 has been energized to hold the wafer 20, the scanner mechanism 204 may cause the wafer 20 and platen 206 to rotate, tilt and/or scan up and down to allow a desired ion implantation of the wafer 20 by the ion beam 22. In a PLAD system, the platen 206 may not move.

For ion implantation at a high temperature (i.e., above room temperature), the end station 200 may be configured to include optional pre-heating capabilities, in situ heating or temperature maintenance capabilities, and post-cooling capabilities. In addition, end-effectors of the transfer robots 214 and 216 (i.e., parts of the transfer robots 214 and 216 that contact the wafer 20 during wafer handling) may be made from or coated with a high-temperature-tolerant material such as quartz. For ion implantation at a low temperature (i.e., below room temperature), pre-chilling and post-warming capabilities may be preferably provided in connection with the end station 200.

According to some embodiments, one or more thermal conditioning units may be implemented to pre-heat or pre-chill a target wafer as well as to cool down or warm up the wafer after ion implantation.

For example, a pre-heating station may be provided to heat up a target wafer before it is loaded onto a platen. A pre-heating station may be optional if a wafer can be heated up on a platen at a sufficiently fast rate. On the other hand, it may be desirable to pre-heat a wafer to a temperature close to a hot platen for various reasons. For example, pre-heating a wafer may reduce backside particles since a smaller initial temperature difference between the wafer and a platen lessens thermal expansion of the wafer whilst it is clamped to the platen, which is a known cause of backside particle generation. In addition, pre-heating a wafer may allow a high-temperature ion implantation process to start sooner and thereby reduce the amount of time the wafer has to spend on a platen.

For low-temperature ion implantation, a pre-chilling station may be desirable since in situ cooling of a wafer on a platen may be slow or inefficient. A sufficiently pre-chilled wafer may receive low-temperature ion implantation almost as soon as it is loaded onto a platen.

For high-temperature and low-temperature ion implantation, it may be desirable to provide post-cooling and post-warming stations, respectively. It is preferable to unload a wafer to atmosphere at approximately room temperature. In a single-wafer ion implanter, in order to achieve a relatively high throughput suitable for production (e.g., at least 20-30 wafers per hour for a high dose implant, and up to 500 wafers per hour for low dose processes), it is desirable that a platen become available to process a next wafer as soon as possible. Therefore, the post-implant task of restoring a wafer to room temperature is advantageously accomplished with one or more thermal conditioning units that are separate from a platen.

The aforementioned thermal conditioning units (e.g., pre-chilling station, pre-heating station, post-cooling station, or post-warming station) may be implemented as part of the loadlocks 210 and 212 or in other parts of the process chamber 202 (e.g., the orientor 208). Alternatively, a thermal conditioning unit may be enclosed in a vacuum space separate from that of the process chamber 202.

Figure 3:
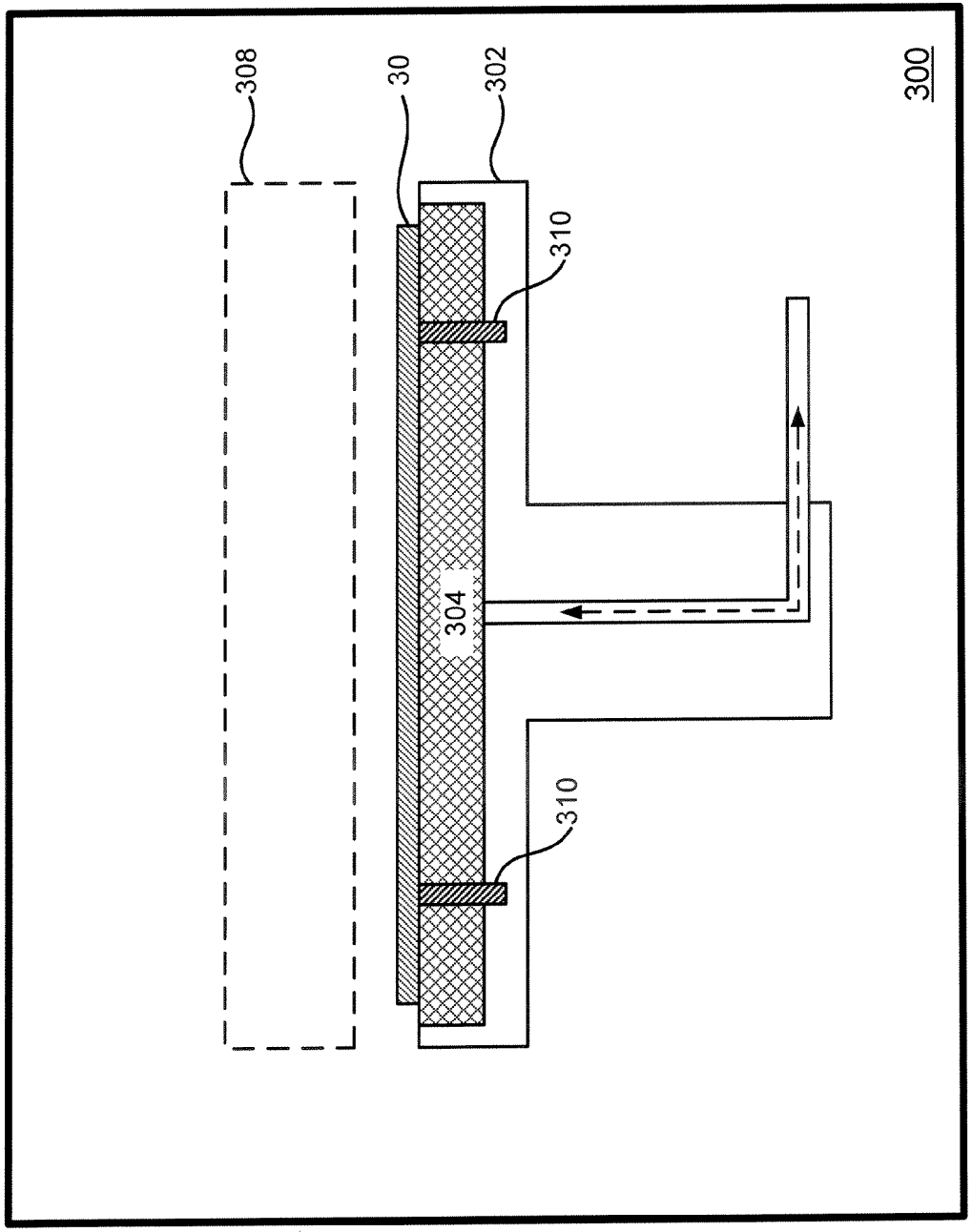
FIG. 3 shows a block diagram illustrating an exemplary thermal conditioning unit in accordance with an embodiment of the present disclosure.

FIG. 3 shows a block diagram illustrating an exemplary thermal conditioning unit 300 in accordance with an embodiment of the present disclosure. The thermal conditioning unit 300 may comprise a wafer holder 302 that can hold and heat/cool a wafer 30 placed thereon. The wafer holder 302 may be a simple fixed platen as there is typically no need to tilt or rotate the wafer during its pre-chilling, pre-heating, post-cooling, or post-warming processes. According to one embodiment, the wafer 30 may be coupled to the wafer holder 302 with a backside gas (e.g., helium or nitrogen).

As mentioned above, the thermal conditioning unit 300 may comprise cooling and/or heating mechanisms that employ any of a number of techniques to bring the wafer 30 to a desired temperature range. For pre-chilling and/or post-cooling purposes, for example, a backside cooling assembly 304 may cool the backside of the wafer 30, and/or a front-side cooling assembly 308 may cool the wafer 30 from the front side. This may require gas to aid thermal conduction between the wafer 30 and cooler 308. Similarly, for pre-heating and/or post-warming purposes, the backside cooling assembly 304 may be replaced with embedded heating elements (not shown), and the front-side cooling assembly 308 may be replaced with a radiant heating assembly (not shown).

In addition to heating/cooling capabilities, the wafer holder 302 may also accommodate automatic wafer handling. For example, there may be provided a set of lift pins 310 to keep the wafer 30 in a wafer transfer plane during loading and unloading by robotic arms.

FIG. 4A shows an exemplary platen 400 for high-temperature ion implantation in accordance with an embodiment of the present disclosure. The entire platen 400 may be coupled to a scanner mechanism 418 that facilitates various movements of the platen 400.

The platen 400 may comprise a dielectric plate 402 and an interface plate 404. The dielectric plate 402 may have electrodes 406 embedded therein to apply an electrostatic force to hold a wafer 40 onto a surface of the dielectric plate 402. The surface of the dielectric plate 402 may either be smooth or contain mesa structures 410 to reduce backside contact to the wafer 40 and to reduce backside particles. An interface 408 formed between the wafer 40 and the dielectric plate 402 may contain a backside gas to improve or adjust thermal contact therebetween. In addition, one or more heating elements 412 may be embedded in the dielectric plate 402 to heat up the dielectric plate 402 (and the wafer 40) and to maintain a desired high temperature. When the wafer 40 needs to be heated, the heating element(s) 412 may be activated. According to one embodiment, the wafer 40 may radiate approximately 5 kilowatts (kW) at 600° C. Accordingly, to allow for some loss of heat through thermal conductance, the heating element(s) 412 may need a power input of approximately 6 kW. Power cables that deliver this amount of power may be thin and flexible enough to route up through the scanner mechanism 418.

The interface plate 404 may be coupled to the dielectric plate 402 via an interface 414. The interface plate 404 may be an aluminum block containing water/coolant channels 416. The interface plate 404 may also be made of other materials such as titanium, stainless steel, quartz or ceramic, which may be chosen to match the thermal expansion coefficient of different parts of the platen 400 at desired operating temperatures. The interface plate 404 may have a controlled thermal contact with the dielectric plate 402 which can be adjusted through the interface 414. For example, the interface 414 may contain a backside gas that may be evacuated when thermal isolation from the dielectric plate 402 is desired. When filled with the backside gas, the interface 414 may increase heat exchange between the interface plate 404 and the dielectric plate 402. For instance, if, after a high-temperature process, the next processing temperature is around room temperature, it may be inefficient to simply wait for the platen 400 to cool down by radiation loss alone as it will take several minutes during which time the ion implanter remains unproductive. To expedite the cooling of the platen 400, the interface 414 may be filled with a backside gas that increases the thermal conductivity from the dielectric plate 402 to the interface plate 404. There may be a limit to how fast the platen 400 may be allowed to cool down, due to differential contraction of materials. The cool down rate may be controlled by varying the backside gas pressure (in the interface 414) and/or the coolant flow rate (in the coolant channels 416).

Figure 4B:
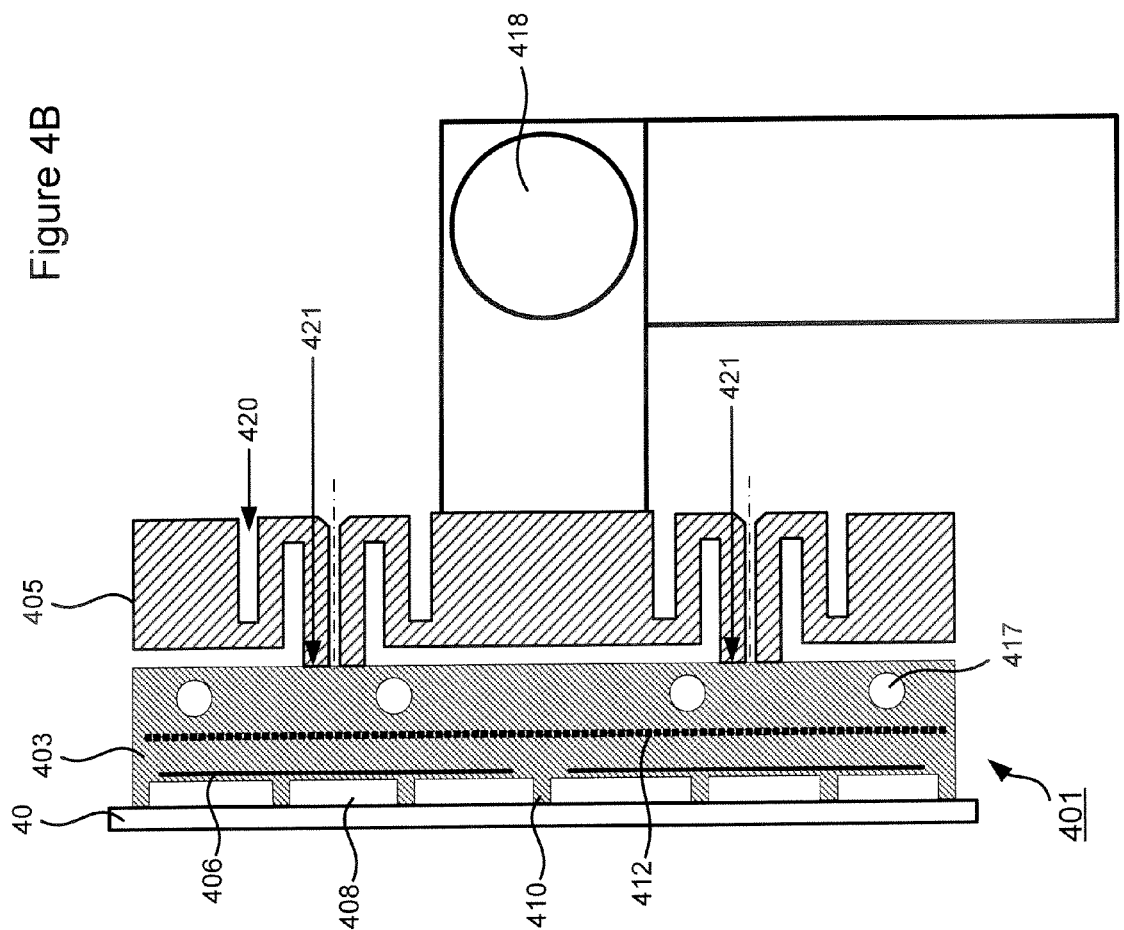
FIG. 4B shows another exemplary platen for high-temperature ion implantation in accordance with an embodiment of the present disclosure.

FIG. 4B shows another exemplary platen 401 for high-temperature ion implantation in accordance with an embodiment of the present disclosure. Compared to the platen 400, the platen 401 may comprise a dielectric plate 403 similar to the dielectric plate 402 (e.g., with the embedded electrodes 406, mesa structures 410, and heating elements 412), except that the dielectric plate 403 may have coolant channels 417 embedded therein. Instead of having the interface plate 404 which is coupled to the dielectric plate 402 via the gas interface 414 the platen 401 comprises a thermal break plate 405 with a "labyrinth" design. The thermal break plate 405 may make thermal contact with the dielectric plate 403 via small contact areas 421 only. The thermal break plate 405 may also have labyrinth slots 420 to increase the length of thermal conduction path and therefore add resistance to heat transfer from the dielectric plate 403 and the wafer 40. In these ways the platen 401 and the wafer 40 are allowed to heat up or cool down whilst the scanner mechanism 418 may remain largely at room temperature. It should be noted that the labyrinth design shown in FIG. 4B is only exemplary and other patterns or arrangements of labyrinth slots 420 may also be implemented. When the wafer 40 and platen 401 are at high temperature, the flow of coolant to the coolant channels 417 may be interrupted to allow the wafer 40 and platen 401 to reach a high temperature. This may be particularly important if the platen temperature exceeds the boiling point of a liquid coolant (e.g. such as water). If the coolant is a gas, the flow may be interrupted or reduced. Any remaining gas flow may be used in combination with the heat source to control the platen temperature.

The design of the platen 401 may offer some advantages over the platen 400. For example, the platen 401 may provide better heat sinking from the wafer 40, especially during high-dose and/or high-energy ion implantation. Gas leakage problems between the interface plate 404 and the dielectric plate 402 may be avoided. Furthermore, there may be fewer differential thermal expansion issues among the components which would otherwise make mechanical assembly difficult.

Figure 5:
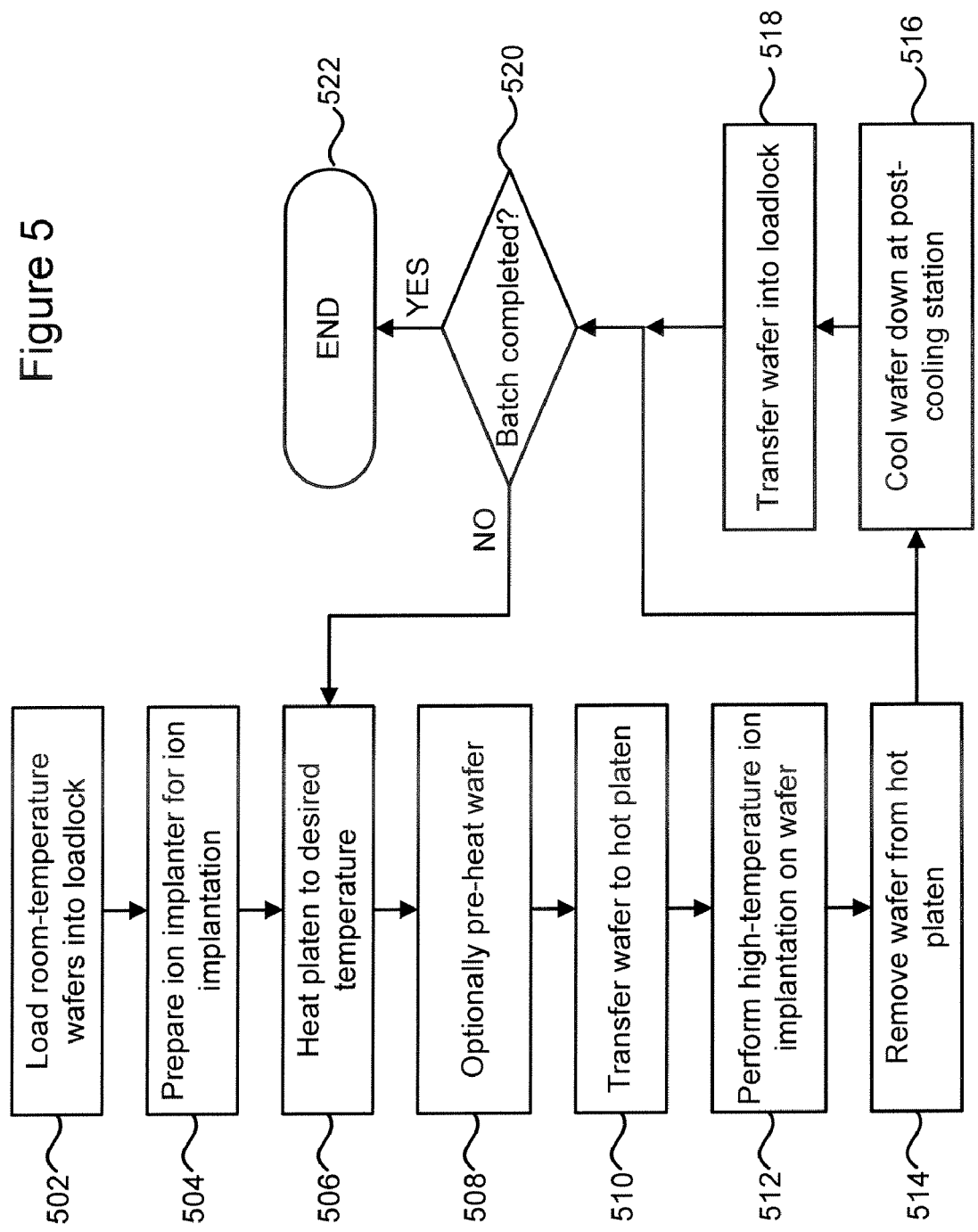
FIG. 5 shows a flow chart illustrating an exemplary method for high-temperature ion implantation in accordance with an embodiment of the present disclosure.

FIG. 5 shows a flow chart illustrating an exemplary method for high-temperature ion implantation in accordance with an embodiment of the present disclosure. This exemplary method may utilize the above-described thermal conditioning unit 300 and platen 400 or other similar components.

In step 502, one or more room-temperature wafers may be loaded into a loadlock which is coupled to a wafer end station in a single-wafer ion implanter. The wafers may be loaded in a batch but will receive ion implantation one at a time.

In step 504, the single-wafer ion implanter may be prepared for an upcoming ion implantation process. The preparation may include tuning various components in the ion implanter to achieve a desired ion beam dose (or current), angle and uniformity profiles.

In step 506, a wafer platen may be heated to a desired temperature range above room temperature. The wafer platen is preferably heated with heating elements embedded therein. The wafer platen may also include or be coupled to a cooling mechanism such that the platen temperature may be more precisely and efficiently controlled. The platen preferably has a large thermal mass, and may have limitations as to how quickly it can be heated up or cooled down in order to limit mechanical stresses in the platen. The platen may be kept at a desired operating temperature or temperature range throughout the processing of the current batch of wafers. The platen may have temperature feedback capabilities to determine when the desired temperature range has been reached. Alternatively, the platen temperature may be determined based on knowledge of a temporal profile of power supplied to the platen.

In some embodiments, steps 502, 504 and 506 may be carried out simultaneously.

In step 508, at the same time when the ion implanter is being tuned (step 504) and/or when the platen is being heated (step 506), a target wafer may be optionally pre-heated to the platen temperature or within a range of the platen temperature. The wafer may be pre-heated, for example, in the loadlock, on a hot plate in the end station, or in a process chamber separate from the end station. This wafer pre-heating step may be skipped in some embodiments.

In step 510, the target wafer may be transferred onto the now hot platen. The wafer may be electrostatically clamped to the platen. If the wafer has already been pre-heated to a temperature close to the platen temperature, it may take little or no time for the wafer to reach thermal equilibrium with the platen. If the wafer has not been pre-heated or is at room temperature, it may take a few seconds for the platen to heat up the wafer. Normally, the wafer needs to be properly oriented and centered on the platen. Wafer orientation may be done, for example, prior to loading into the loadlock, in the loadlock itself, or on an orientor in the end station. The orientor may be, for example, a dedicated mechanical assembly or may use a camera and image recognition software. The camera-assisted technique may allow orientation to be carried out on the platen.

After being loaded onto the hot platen, the wafer may be allowed to heat up to a pre-implant temperature. There may be a trade-off between the rate of heating and backside particle generation. If the wafer, at a lower temperature than the hot platen, is immediately clamped by an electrostatic force, thermal expansion of the wafer relative to the hard platen surface may cause mechanical damages and generate backside particles. To avoid such damages or particles, the wafer may first be placed onto the platen in a horizontal load position and allowed to heat up by radiation. Once a determined intermediate temperature is reached, the electrostatic clamp (ESC) in the platen may be switched on. Electrostatic clamping may increase thermal conduction between the wafer and the platen. A backside gas may be introduced at this time or a later time to further increase the thermal conduction between the wafer and the platen. The clamping force and gas pressure may be changed at a controlled rate or in steps to maximize heat-up rate with minimal backside particle generation. Electrical power supplied to the platen may also be varied, for example, by monitoring the platen and wafer temperatures or on a timed basis by following a temporal profile that has been found to produce desired results. The temporal profile may vary with implant temperature, and may be stored as a recipe.

In step 512, high-temperature ion implantation may be performed on the target wafer. Both the wafer and the platen may be maintained in a desired temperature range during the ion implantation process. Since the wafer and the platen may be at an elevated temperature well above room temperature, a significant amount of radiant heat may be lost to the surrounding. Therefore, some amount of heating power may be needed to prevent the wafer from experiencing any substantial temperature drop.

The initial wafer temperature, when ion implantation starts, may not be the ultimate temperature reached during ion implantation. An ion beam may inject energy into the wafer, further increasing its temperature. The initial wafer temperature may be chosen to account for the beam heating. If beam heating is excessive, it is possible to reduce the power to the platen in response to a thermocouple or pyrometer feedback or to change thermal conduction (e.g., by adjusting gas pressure in either or both of the interfaces 408 and 414 as shown in FIG. 4A). Alternatively, the implant may be paused from time to time to allow the wafer to cool down to the desired temperature range. Also, the coolant channels 416 may facilitate backside cooling of the platen 400. According to another embodiment, the beam current may be lowered to reduce excessive beam heating. The beam ions may be produced by a beam-line ion implanter, or as part of a plasma doping process.

The wafer temperature may be monitored and used to control the high-temperature ion implantation and wafer heating conditions. Alternatively, it is possible to follow previously established temporal heating and implant profiles without measuring the wafer temperature or using temperature information for feedback control.

In step 514, upon completion of ion implantation, the wafer may be immediately removed from the hot platen, leaving the platen available for a next wafer in the batch. The wafer that has just received high-temperature ion implantation may be transferred, in step 516, to a post-cooling station to be cooled down to a predetermined range within room temperature. Then, in step 518, the cooled wafer may be transferred to a loadlock, ready to be unloaded into atmosphere. Alternatively, the hot wafer may be transferred directly into the loadlock if the loadlock is designed to accommodate wafers at high temperature. The loadlock in step 518 may be the same loadlock from which the wafer was originally loaded (in step 502), or it may be a different loadlock.

The heat loss by the wafer through convection is much faster than through radiation alone. Therefore, if the loadlock is of a single wafer type, it may be immediately vented, for example, with dry nitrogen. The wafer may be allowed to reach a safe temperature before being removed from the loadlock. The venting may not be started before the wafer has reached a threshold temperature determined either from a direct measurement or from leaving the wafer a set period of time. This threshold temperature may be dependent on the implant temperature. The critical temperature below which the wafer can be safely removed from the loadlock in step 518 may be related to mechanical safety of the wafer and handling equipment or personnel. In one embodiment, the critical temperature is 60° C. If the loadlock is of a batch type, venting may not proceed as above until a number of wafers are in the loadlock. It may be advantageous (for a high throughput) to wait until the loadlock is full, or it may be advantageous to vent before the loadlock is full. The choice may depend on the length of the ion implantation step 512 and the wafer temperatures required (for implant and unloading).

In alternative embodiments, cooling of a wafer may be sped up by placing a cool surface (e.g., a chilled metal plate) near the wafer and supplying gas to allow convectional and conductive cooling to that cool surface. In a single-wafer loadlock, a chilled metal plate may be place above a hot wafer that is to be cooled. In a batch loadlock, chilled metal plates may be placed above and/or below each wafer. Alternatively, only the last wafer in a batch may have a chilled metal plate placed above it, if process time has allowed earlier wafers in the batch to cool sufficiently.

The post-cooling steps 516 and 518 may take place at the same time when the next wafer is processed. That is, after the current wafer is removed from the platen in step 514, it may be determined in step 520 whether the current batch of wafers (initially loaded in step 502) have been completed. If so, the process may end in step 522. Otherwise, the process may loop back to step 506. The platen temperature may be confirmed and adjusted, if necessary, in step 506. Whereupon, the next wafer may be pre-heated (optional), loaded to the hot platen for ion implantation, and then unloaded for post-cooling in steps 508-518. The process may be repeated until all wafers in the current batch have been processed.

Figure 6:
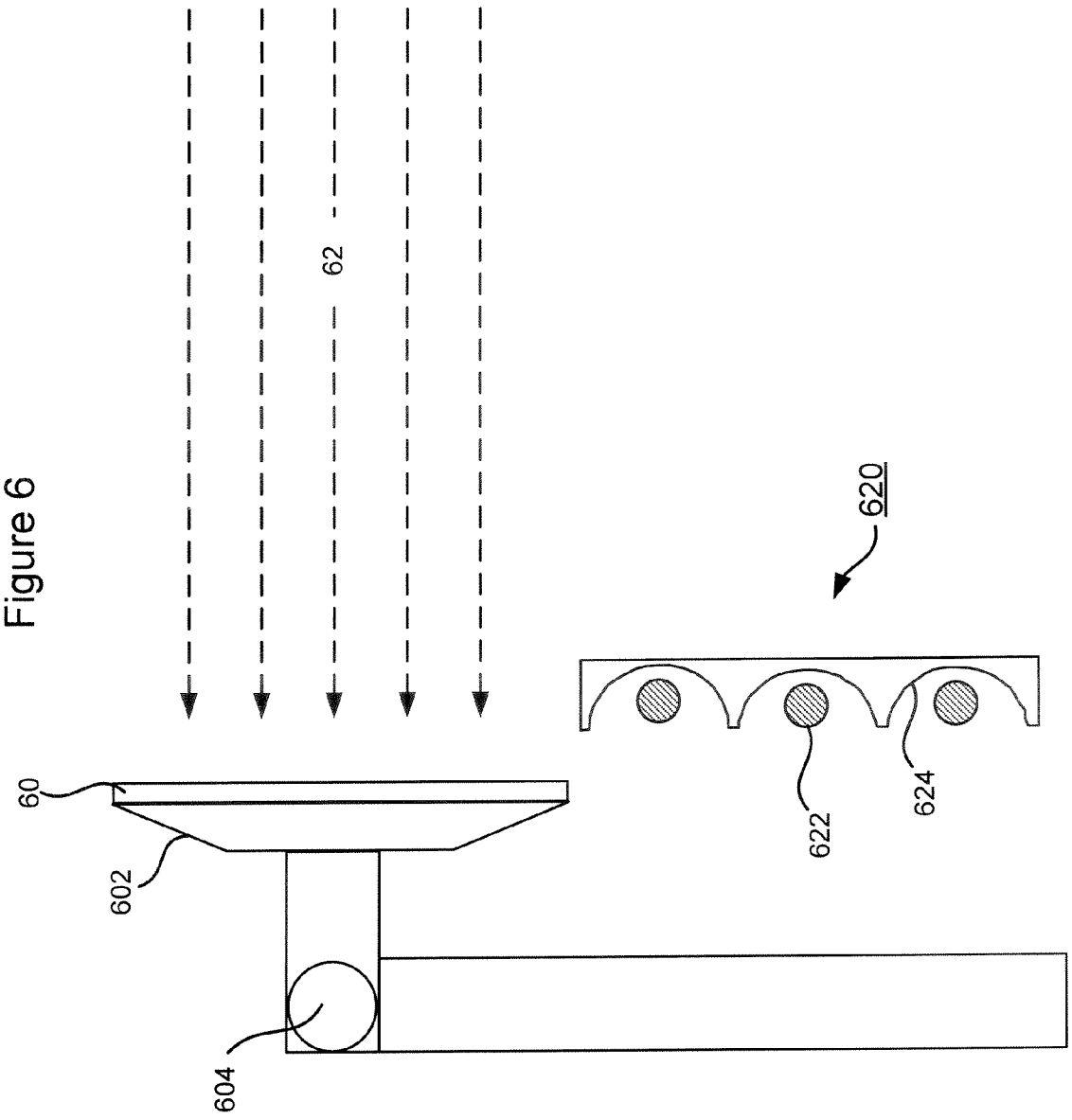
FIG. 6 illustrates another exemplary method for heating a wafer for high-temperature ion implantation in accordance with an embodiment of the present disclosure.

FIG. 6 illustrates another exemplary method for heating a wafer for high-temperature ion implantation in accordance with an embodiment of the present disclosure. In this embodiment, a wafer 60 may be held on a platen 602 and may be heated with a heat source 620 that is external to the platen 602.

Figure 7:
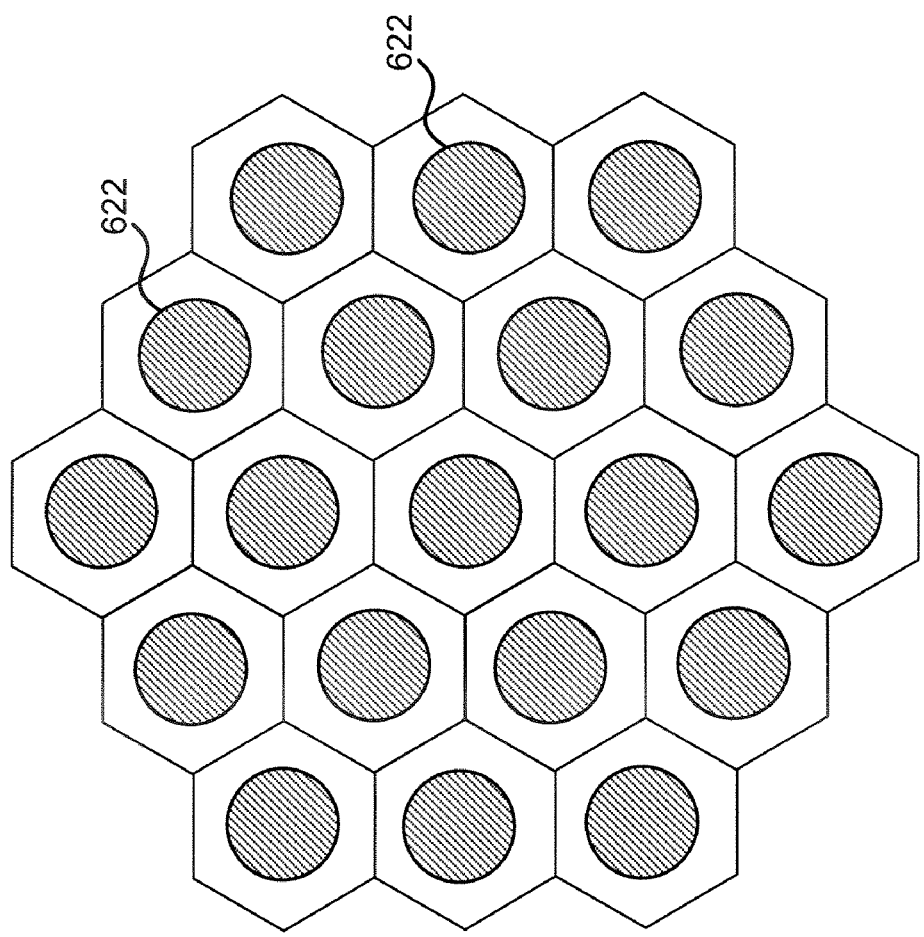
FIG. 7 shows an exemplary pattern of heater lamps in accordance with an embodiment of the present disclosure.

The heat source 620 may comprise an array of heater lamps 622 that are each mounted in front of a reflector 624. The heater lamps 622 may be linear lamps, arranged in parallel with one another. Alternatively, the heater lamps may be circular bulbs and may arranged in a circular array. The array of heater lamps 622 may also be arranged according to various grid patterns. For example, the heater lamps 622 may be evenly spaced to form a simple Cartesian grid. Alternatively, the heater lamps 622 may laid out in a hexagonal grid as shown in FIG. 7. Additionally or alternatively, the heat source 620 may also include one or more laser devices, of various wavelengths. According to one embodiment, a laser wavelength in the infrared range may be efficiently absorbed by the wafer 60.

When heating the wafer 60 with the external heat source 620, it is desirable to obtain a substantially uniform temperature profile across the surface of the wafer 60. However, different portions of the wafer 60 may have different material composition and/or surface structures that give rise to different emissivities in different locations on the wafer 60, causing the wafer 60 to absorb heat unevenly from the heat source 620. In order to combat the emissivity variations, the wafer temperature may need to be closely monitored. The heater lamps 622 may be individually controlled and collectively calibrated (e.g., on a test wafer) to achieve a desired temperature profile on the wafer 60.

As shown in FIG. 6, the heater lamps 622 are positioned below the trajectory of an ion beam 62, heating the wafer 60 in a vertical position. According to another embodiment, the wafer 60 may also be heated in a horizontal orientation when it is not electrostatically clamped to the platen 602, thereby mitigating backside damage. The heater lamps 622 may also be positioned above the ion beam 62, both above and below the ion beam 62, or may be directed to shine heat onto the same spot as the ion beam 62 hits the wafer 60. Ion implantation may be carried out using the ion beam 62. Alternatively, the ion beam 62 may be replaced by ions from a plasma discharge, allowing this lamp-heating technique to be used in plasma doping.

There may be an issue of photoresist residue coating of the heater lamps 622 during regular, room-temperature implants. This may not be an issue during high-temperature ion implantation because solid masks are typically used instead of polymer-based photoresist which degrades above 100° C. In the temperature range between room temperature and 100° C., the array of heater lamps 622 may be covered or be mechanically moved so that vapor from photoresist outgassing cannot condense on the heater lamps 622 or the reflectors 624. The heater lamps 622 may also be heated to burn off contamination deposited on the bulbs and the reflectors 624. Alternatively, the temperature of the heater lamps 622 may be continuously maintained above the temperature at which photoresist vapors condense.

The platen 602 may be coupled to a scanner mechanism 604. When the wafer 60 is to be heated with the heat source 620, it is preferable that the platen 602 have minimal thermal contact with the wafer 60. For example, if the platen design (400) as shown in FIG. 4A is used, it may be beneficial to allow the dielectric plate 402 to contact the wafer 40 (60 in FIG. 6) only through the mesa structures 410 and not to supply any backside gas to the interface 408. In fact, the platen 602, with a conventional design that has been used for room-temperature ion implantation, may be used to hold the lamp-heated wafer 60 without much modification. Since the wafer 60 reflects or absorbs much of the heat from the heat source 620, the platen 602 may not get as hot as the wafer 60 and therefore may be of a similar design as conventional platens. Also, no design change in thermal conductivity paths is required in the platen 602, and therefore there is minimal influence on the heat sinking capability of the platen 602 for room-temperature implants.

In accordance with an embodiment of the present disclosure, thermal isolation between the wafer 60 and the platen 602 may be improved with a "spider" structure 800 as shown in FIGS. 8A and 8B. FIG. 8A shows a top view of the "spider" structure 800, and FIG. 8B shows a cross-sectional side view of the "spider" structure 800. The "spider" structure 800 may have a peripheral size that is approximately the same as a wafer 80. The "spider" structure 800 is positioned between the wafer 80 and a platen 82 such that the wafer 80 rests on the "spider" structure 800 instead of directly on the platen 82. For clarity, the wafer 80 is not shown in FIG. 8A.

The "spider" structure 800 may include an inner ring 815 to which lift pins 840 may engage to push up the "spider" structure 800 and the wafer 80 thereon. The "spider" structure 800 may also comprise an outer ring 810 on which three contact points 845 are mounted. The contact points 845 may be made of a non-contaminating, non-particle-generating material such as, for example, ceramic, nylon, Teflon, silicon dioxide ($SiO_2$), silicon carbide (SiC), graphite-loaded Teflon, or graphite. The material may be conductive to avoid charging the wafer 80 during ion implantation.

Three wafer stops, 820, 825 and 830, may be mounted to the platen 82 in locations corresponding to the positions of the three contact points 845 on the "spider" structure 800. FIG. 8B shows the wafer 80 being held in a position above the platen 82 so that it may receive ion implantation. The lift pins 840 are in their up position, such that the wafer 80 is gripped between the contact points 845 and their corresponding contact points on the wafer stops 820, 825 and 830.

To unload the wafer 80 after ion implantation, the platen 82 may be put in a horizontal load position. The lift pins 840 may be lowered to allow the "spider" structure 800 and the wafer 80 to sit on the surface of the platen 82. The "spider" structure 800 may have spokes 835 that are so designed as to allow an end effector of a robotic arm (not shown) to slide underneath the wafer 80 in a direction as indicated by Arrow 1. The wafer 80 may then be lifted slightly and removed in a direction as indicated by Arrow 2.

The "spider" structure 800 may be designed to be removable by automated handling, and the wafer stops 820, 825 and 830 may be designed to move away from the implant area (in a radially outward direction and/or behind the wafer plane) or be removable by automated handling, so that conventional room-temperature implants may be carried out with the wafer electrostatically clamped to the platen. Alternatively, the "spider" structure 800 and the wafer stops 820, 825 and 830 may be designed to be quickly removable by hand.

Alternative methods of supporting the wafer 80 above the platen 82 may involve holding the wafer 80 by its edge only. Care should be taken to avoid mechanical damage of the wafer edge and particle generation. According to an alternative embodiment, the wafer 80 may be supported by small-area electrostatic pads (not shown) which only contact the backside of the wafer 80 in a few places. The pads may need to be designed so that temperature gradients do not appear across the wafer 80.

FIG. 9 shows a flow chart illustrating an exemplary method for high-temperature ion implantation in accordance with an embodiment of the present disclosure. This exemplary method may utilize the above-described external heat source 620 and "spider" structure 800 or other similar components.

In step 902, one or more room-temperature wafers may be loaded into a loadlock which is coupled to a wafer end station in a single-wafer ion implanter. The wafers may be loaded in a batch but will receive ion implantation on an individual basis.

In step 904, the single-wafer ion implanter may be tuned in preparation for a high-temperature ion implantation process.

In step 906, a target wafer may be optionally pre-heated. The pre-heating may take place in the loadlock, on a hot plate in the end station, or in a separate chamber in or coupled to the end station. Pre-heating of the wafer may help reduce the time it takes for the wafer to warm up on a platen, degas the wafer, and increase wafer emissivity.

According to some embodiments, steps 902, 904 and 906 may be carried out simultaneously.

In step 908, the target wafer may be transferred onto the platen. The wafer may be electrostatically clamped to the platen initially in a horizontal load position. The platen may then rotate the wafer to a vertical position, ready to translate the wafer through an ion beam or in front of an array of heater lamps.

In step 910, the wafer may be heated up to a desired pre-implant temperature by the array of heater lamps. The array of heater lamps may be configured to create a desired, preferably uniform, temperature profile on the wafer.

In step 912, high-temperature ion implantation may be performed on the wafer. In the exemplary configuration shown in FIG. 6, the wafer 60 may be moved away from the heater lamps 622 and up and down through the ion beam 62. When the wafer 60 is not in front of the heater lamps 622, the heater lamps 622 may be switched off, or their power output lowered to reduce thermal loads hitting other parts of the end station. At the end of each up-and-down cycle, the wafer 60 may move back in front of the heat source 620. The wafer 60 may be held stationary in front of the heater lamps 622 for a period of time to heat up the wafer 60 if its temperature has dropped significantly. If beam heating is excessive, the duty cycle involving alternate heating and implant or the power to the heater lamps 622 may be adjusted in response to a thermocouple or pyrometer feedback. Alternatively, the implant may be paused from time to time with the lamps switched off to let the wafer cool down to a desired temperature range. In another embodiment, the beam current may be simply reduced.

The wafer temperature may be monitored and used to control the high-temperature ion implantation and wafer heating conditions. Alternatively, it is possible to follow previously established temporal heating and implant profiles without measuring the wafer temperature or using temperature information for feedback control. However, this latter approach may have issues if the front side emissivity of the wafers vary greatly, changing the amount of heat absorbed by different wafers.

In step 914, upon completion of ion implantation, the wafer may be immediately removed from the hot platen to a post-cooling station to cool down, leaving the platen available for a next wafer in the batch. After the wafer has been cooled down, the cooled wafer may be transferred to a loadlock in step 916, ready to be unloaded into atmosphere.

The post-cooling steps 914 and 916 may take place at the same time when the next wafer is processed. That is, after the current wafer is removed from the platen, it may be determined in step 918 whether the current batch of wafers (initially loaded in step 902) have been completed. If so, the process may end in step 920. Otherwise, the process may loop back to step 906. The process may be repeated until all wafers in the current batch have been processed.

According to some embodiments, heater lamps or similar heating elements may be positioned to heat a backside of a wafer. For example, a wafer may be supported on a hollow platen with a supporting member similar to the "spider" structure 800 described above. The hollow platen may house an array of heater lamps, filaments, or other heating elements to heat the backside of the wafer. Backside heating may offer some benefits over front-side heating (as illustrated in FIG. 6). For example, on the backside of the wafer, emissivity variation is much less an issue than the front side.

Figure 10:
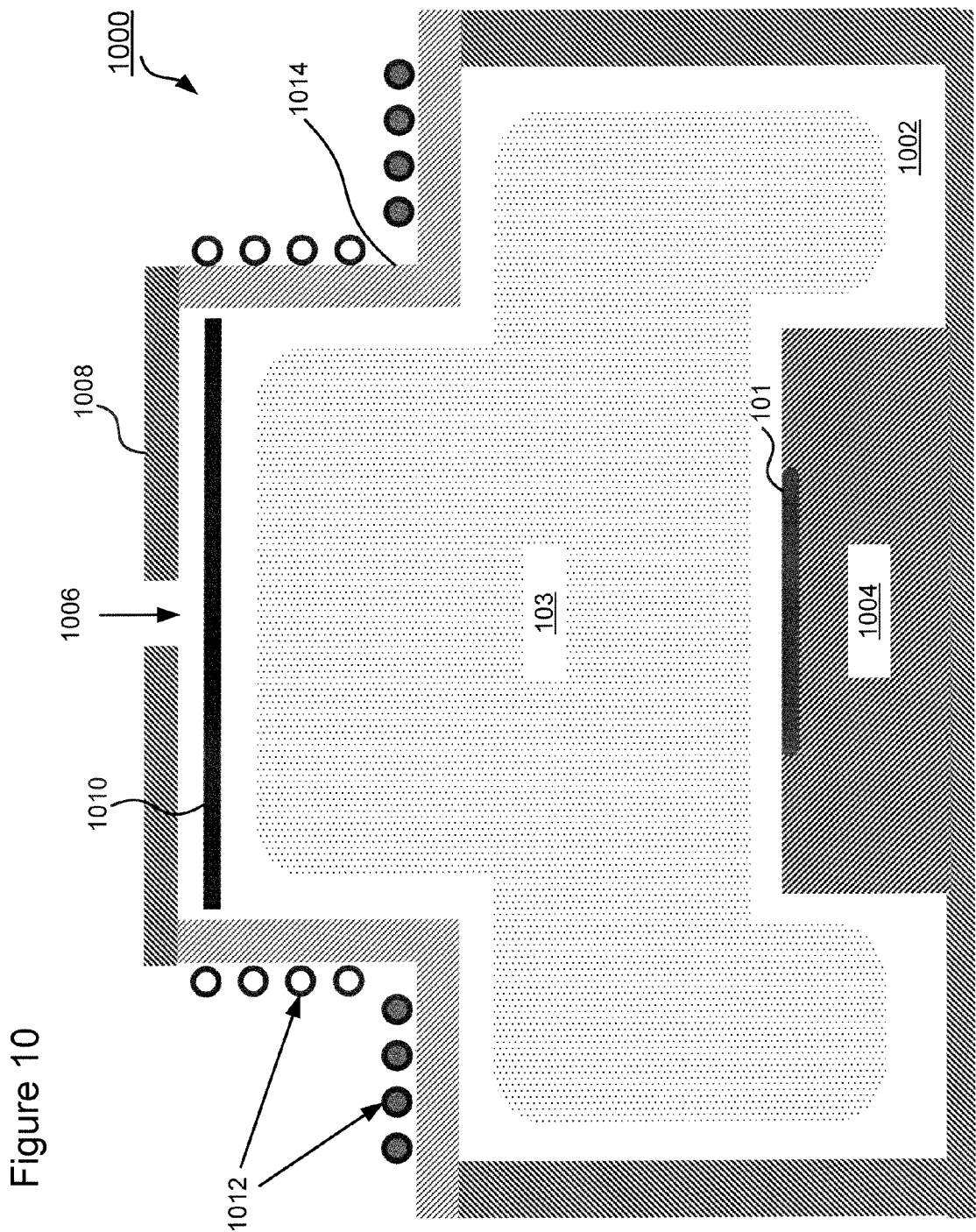
FIG. 10 depicts an exemplary plasma doping (PLAD) system 1000 in which plasma heating techniques may be implemented in accordance with an embodiment of the present disclosure.

As briefly mentioned above, the heater lamps or the platen are not the only means for heating or maintaining temperature of a wafer. According to some embodiments, a plasma discharge may also be utilized to provide thermal energy to a wafer. FIG. 10 depicts an exemplary plasma doping (PLAD) system 1000 in which plasma heating techniques may be implemented in accordance with an embodiment of the present disclosure.

The system 1000 may comprise a process chamber 1002 having a platen 1004 to hold a wafer 101. One or more reactive gases may be fed into the process chamber 1002 via a gas inlet 1006 in a top plate 1008. The reactive gas(es) may then go through a gas baffle 1010 before entering the process chamber 1002. A group of coils 1012 may couple radio frequency (RF) electrical power into the process chamber 1002 through an aluminum oxide ($Al_2O_3$) window 1014. The RF power may produce a plasma discharge 103 from the reactive gas(es). A proper bias (DC or RF) may be applied to the wafer 101 or the platen 1004 to draw charged particles from the plasma discharge 103.

For high-temperature ion implantation, the wafer 101 may be pre-heated with the platen 1004 and/or the plasma discharge 103. In a preferred embodiment, the wafer 101 may be pre-heated with the plasma discharge 103 alone, and the platen 1004 may have minimal thermal contact with the wafer 101, such that there is reduced or no cooling of the wafer 101 by the platen 1004. To pre-heat the wafer 101, the plasma discharge 103 is preferably created from an inert gas species that will not contaminate the wafer 101. It is also desirable that the plasma discharge 103 has a high plasma density. Parameters of the plasma discharge 103, as well as the wafer bias (DC or RF), may be tuned to control the rate at which the wafer 101 heats up and how high the wafer temperature rises. For example, the cooling of the wafer 101 during ion implantation may be reduced by turning down backside gas or contact. As soon as the wafer 101 reaches a desired pre-implant temperature, a dopant-containing plasma may be created to implant dopants into the pre-heated wafer 101.

Figure 11:
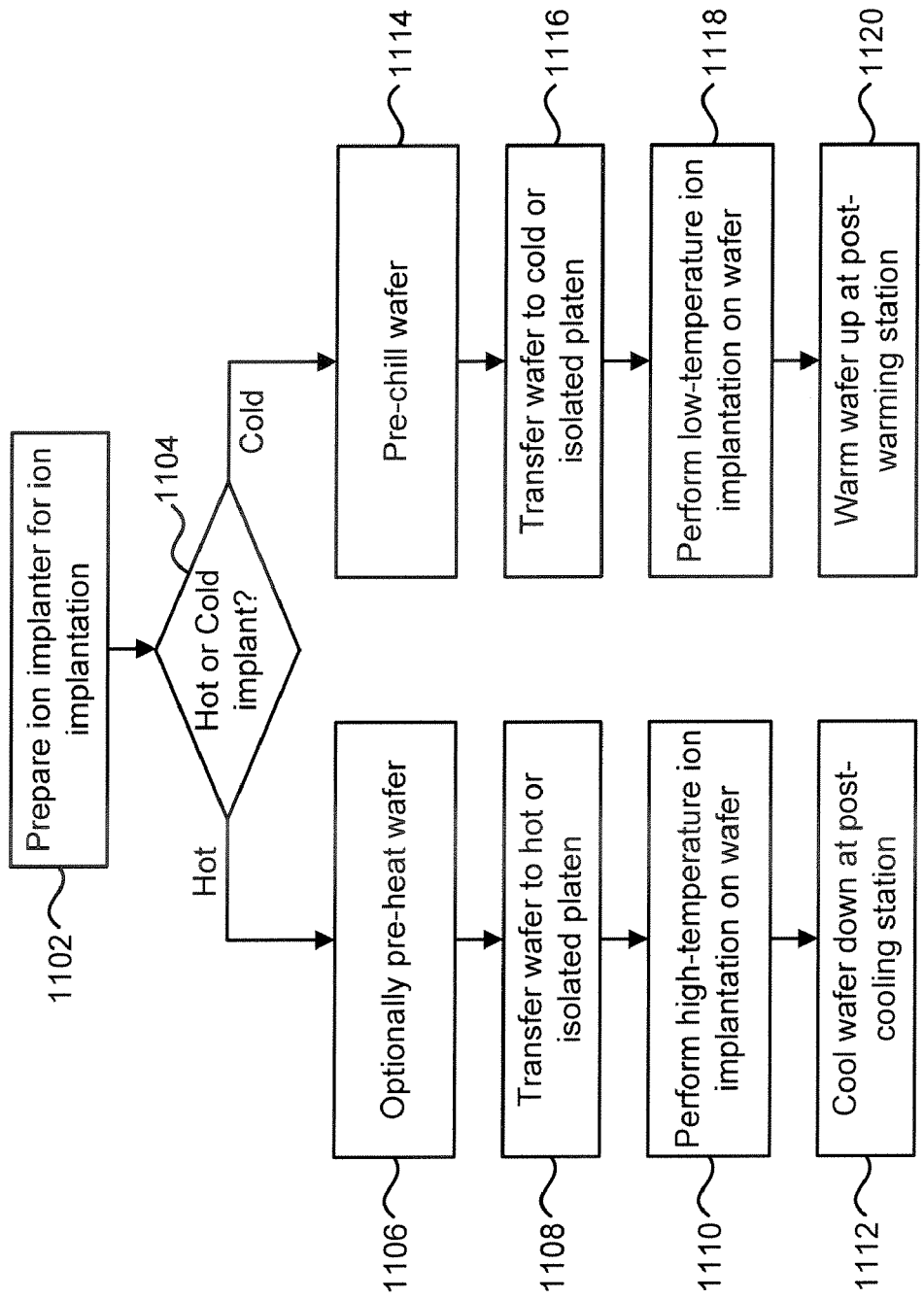
FIG. 11 shows a flow chart illustrating an exemplary method for performing ion implantation over a wide temperature range in an ion implanter in accordance with an embodiment of the present disclosure.

FIG. 11 shows a flow chart illustrating an exemplary method for performing ion implantation over a wide temperature range in an ion implanter in accordance with an embodiment of the present disclosure.

In step 1102, an ion implanter may be tuned in preparation for an ion implantation process on a target wafer.

In step 1104, it may be determined whether the ion implantation process will be a high-temperature (hot) one or a low-temperature (cold) one. Though not described here, the desired ion implantation process may be at room temperature.

If the ion implantation process will be at a high temperature (above room temperature), the target wafer may be optionally pre-heated in step 1106, for example, at a pre-heating station. Next, in step 1108, the wafer may be transferred onto a platen. For a pre-heated wafer, the platen may be unheated and thermally isolated from the wafer. For a wafer that has not been pre-heated, the platen may heat up the wafer to a desired pre-implant temperature. Then, in step 1110, high-temperature ion implantation may be performed on the wafer. In step 1112, immediately after ion implantation is completed, the wafer may be removed from the platen and cooled down at a post-cooling station.

If the ion implantation process will be at a low temperature (below room temperature), the target wafer may be pre-chilled in step 1114 on a pre-chilling station. The wafer may be pre-chilled to a desired low temperature at which it will receive ion implantation. Next, in step 1116, the wafer may be transferred onto a cold or thermally isolated but unchilled platen. Then, in step 1118, low-temperature ion implantation may be performed on the wafer. In step 1120, immediately after ion implantation is completed, the wafer may be removed from the platen and warmed up at a post-warming station.

Although FIG. 11 only shows two temperature modes (i.e., cold and hot), a temperature-controlled ion implanter may employ the above-described techniques to support a high-temperature mode, a room-temperature mode, and a low-temperature mode. In addition, the thermal conditioning units mentioned in connection with FIG. 11 need not be dedicated pre-chilling station, pre-heating station, post-cooling station, or post-warming station. Instead, one thermal conditioning unit may serve both pre-implant and post-implant functions. For example, in a low-temperature mode, a first thermal conditioning unit may serve as a pre-chilling station and a second thermal conditioning unit may serve as a post-warming station. Then, in a high-temperature mode, the second thermal conditioning unit may serve as a pre-heating station and the first thermal conditioning unit may serve as a post-cooling station. An automated wafer handling system may be programmed to transfer a wafer among the thermal conditioning units and a platen in a specified sequence based on the temperature mode in which the ion implanter is operating.

At this point it should be noted that the techniques for temperature-controlled ion implantation in accordance with the present disclosure as described above typically involve the processing of input data and the generation of output data to some extent. This input data processing and output data generation may be implemented in hardware or software. For example, specific electronic components may be employed in an ion implanter or similar or related circuitry for implementing the functions associated with temperature-controlled ion implantation in accordance with the present disclosure as described above. Alternatively, one or more processors operating in accordance with stored instructions may implement the functions associated with temperature-controlled ion implantation in accordance with the present disclosure as described above. If such is the case, it is within the scope of the present disclosure that such instructions may be stored on one or more processor readable carriers (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for high-temperature ion implantation, the apparatus comprising:
   a platen to hold a wafer in a single-wafer process chamber during ion implantation, the platen having a wafer interface to provide a predetermined thermal contact between the wafer and the platen;
   an array of heating elements to heat the wafer while the wafer is held on the platen to achieve a predetermined temperature profile on the wafer during ion implantation, the heating elements being external to the platen; and
   a post-implant cooling station to cool down the wafer after ion implantation of the wafer.

2. The apparatus according to claim 1, wherein at least one portion of the wafer is heated by the array of heating elements when the wafer is scanned at least partially outside the coverage of an ion beam, thereby providing continuous heating of the wafer during ion implantation.

3. The apparatus according to claim 2, wherein the wafer is continuously monitored for temperature changes, and wherein the continuous heating of the wafer with the array of heating elements is adjusted based on the monitored temperature changes.

4. The apparatus according to claim 2, wherein the array of heating elements is adjusted to a lower heat output when the wafer is heated by the ion beam.

5. The apparatus according to claim 1, wherein at least one portion of the array of heating elements have adjustable heat output, and wherein the array of heating elements are adjusted to produce a substantially uniform temperature across the wafer.

6. The apparatus according to claim 1, wherein the array of heating elements is arranged in a grid pattern selected from a group consisting of a hexagonal pattern, a Cartesian pattern, and a circular pattern.

7. The apparatus according to claim 1, further comprising:
at least one sensor to detect wafer temperature at one or more wafer locations.

8. The apparatus according to claim 7, wherein the at least one sensor comprises a single contact-less temperature sensing device to estimate an average wafer temperature, and wherein the array of heating elements are configured to achieve a predetermined average wafer temperature based on the estimated average wafer temperature.

9. The apparatus according to claim 7, wherein the at least one sensor comprises multiple contact-less temperature sensing devices to detect wafer temperatures at multiple wafer locations, and wherein the array of heating elements are configured to achieve the predetermined temperature profile on the wafer based on the detected wafer temperatures.

10. The apparatus according to claim 1, wherein the array of heating elements are selected from a group consisting of radiation lamps and laser heating devices.

11. The apparatus according to claim 1, wherein the array of heating elements are positioned to heat a front side of the wafer.

12. The apparatus according to claim 11, wherein the platen is configured to have a sufficiently small thermal contact with a back side of the wafer to prevent substantial heat loss to the platen.

13. The apparatus according to claim 11, wherein the platen is coupled to a support structure configured to lift the wafer off from the front side of the platen to minimize thermal conduction from the wafer to the platen.

14. The apparatus according to claim 1, wherein the array of heating elements are positioned to heat a back side of the wafer.

15. The apparatus according to claim 1, wherein the thermal contact between the wafer and the platen is reduced by elevating the wafer above the platen surface with a support structure.

16. The apparatus according to claim 1, wherein the thermal contact between the wafer and the platen is reduced by reducing a clamping voltage or a backside gas pressure.

17. The apparatus according to claim 1, further comprising:
a heating mechanism to pre-heat the wafer before heating the wafer with the array of heating elements.

18. The apparatus according to claim 1, being further configured to support room-temperature ion implantation or low-temperature ion implantation on the wafer.

19. The apparatus according to claim 16, wherein the wafer is pre-chilled before the wafer is loaded onto the platen.

20. The apparatus according to claim 16, wherein the platen is configured to cool the wafer for room-temperature ion implantation or low-temperature ion implantation, and wherein the platen is further configured to be substantially thermally isolated from the wafer when the wafer is heated by the array of heating elements for high-temperature ion implantation.

21. The apparatus according to claim 16, further comprising:
one or more cooling elements to cool the platen; and
a control mechanism coupled to both the array of heating elements and the cooling elements to switch ion implantation among a high-temperature mode, a room-temperature mode, and a low-temperature mode.

22. A method for high-temperature ion implantation, the method comprising the steps of:
holding a wafer on a platen in a single-wafer process chamber;
providing an array of heating elements to heat the wafer while the wafer is held on the platen, the heating elements being external to the platen; and
controlling output intensity of the array of heating elements relative to the platen to achieve a predetermined temperature profile on the wafer during ion implantation.

23. The method according to claim 22, wherein at least one portion of the wafer is heated by the array of heating elements when the wafer is scanned at least partially outside the coverage of an ion beam, thereby providing continuous heating of the wafer during ion implantation.

24. The method according to claim 23, wherein the wafer is continuously monitored for temperature changes, and wherein the continuous heating of the wafer with the array of heating elements is adjusted based on the monitored temperature changes.

25. The method according to claim 23, wherein the array of heating elements is adjusted to a lower heat output when the wafer is heated by the ion beam.

26. The method according to claim 22, wherein at least one portion of the array of heating elements have adjustable heat output, and wherein the array of heating elements are adjusted to produce a substantially uniform temperature across the wafer.

27. The method according to claim 22, wherein the array of heating elements is arranged in a grid pattern selected from a group consisting of a hexagonal pattern, a Cartesian pattern, and a circular pattern.

28. The method according to claim 22, further comprising:
detecting wafer temperature at one or more wafer locations.

29. The method according to claim 28, wherein the wafer temperature is detected with a single contact-less temperature sensor to estimate an average wafer temperature, and wherein the array of heating elements are configured to achieve a predetermined average wafer temperature based on the estimated average wafer temperature.

30. The method according to claim 28, wherein the wafer temperature is detected with multiple contact-less temperature sensors to detect wafer temperatures at multiple wafer locations, and wherein the array of heating elements are configured to achieve the predetermined temperature profile on the wafer based on the detected wafer temperatures.

31. The method according to claim 22, wherein the array of heating elements are positioned to heat a front side of the wafer.

32. The method according to claim 31, wherein the platen is configured to have a sufficiently small thermal contact with a back side of the wafer to prevent substantial heat loss to the platen.

33. The method according to claim 31, wherein the platen is coupled to a support structure configured to lift the wafer off from the front side of the platen to minimize thermal conduction from the wafer to the platen.

34. The method according to claim 22, wherein the array of heating elements are positioned to heat a back side of the wafer.

35. The method according to claim 22, wherein the thermal contact between the wafer and the platen is reduced by elevating the wafer above the platen surface with a support structure.

36. The method according to claim 22, wherein the thermal contact between the wafer and the platen is reduced by reducing a clamping voltage or a backside gas pressure.

37. The method according to claim 22, further comprising: pre-heating the wafer before heating the wafer with the array of heating elements.

38. The method according to claim 22, further comprising: performing room-temperature ion implantation or low-temperature ion implantation on the wafer.

39. The method according to claim 38, wherein, for the low-temperature ion implantation, the wafer is pre-chilled before the wafer is loaded onto the platen.

40. The method according to claim 38, wherein the platen is configured to cool the wafer for room-temperature ion implantation or low-temperature ion implantation, and wherein the platen is further configured to be substantially thermally isolated from the wafer when the wafer is heated by the array of heating elements for high-temperature ion implantation.

* * * * *